United States Patent
Sato et al.

(10) Patent No.: US 9,589,828 B2
(45) Date of Patent: Mar. 7, 2017

(54) METHOD FOR PHOTOLITHOGRAPHY-FREE SELF-ALIGNED REVERSE ACTIVE ETCH

(71) Applicant: Microchip Technology Incorporated, Chandler, AZ (US)

(72) Inventors: Justin Hiroki Sato, West Linn, OR (US); Gregory Allen Stom, Damascus, OR (US)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 0 days.

(21) Appl. No.: 14/525,543

(22) Filed: Oct. 28, 2014

(65) Prior Publication Data

US 2016/0118293 A1    Apr. 28, 2016

(51) Int. Cl.
  *H01L 21/302*   (2006.01)
  *H01L 21/461*   (2006.01)
  *H01L 21/762*   (2006.01)
  *H01L 29/06*    (2006.01)
  *H01L 21/02*    (2006.01)
  (Continued)

(52) U.S. Cl.
  CPC .... *H01L 21/76224* (2013.01); *H01L 21/0217* (2013.01); *H01L 21/02164* (2013.01); *H01L 21/02238* (2013.01); *H01L 21/02274* (2013.01); *H01L 21/02282* (2013.01); *H01L 21/30604* (2013.01); *H01L 21/31051* (2013.01); *H01L 21/31053* (2013.01); *H01L 21/31055* (2013.01); *H01L 21/31116* (2013.01);
  (Continued)

(58) Field of Classification Search
  CPC .......... H01L 21/31055; H01L 21/0217; H01L 21/31138; H01L 29/0649; H01L 21/02238; H01L 21/02282; H01L 21/30604; H01L 21/02164; H01L 21/31053; H01L 21/76224; H01L 21/02274; H01L 21/31116; H01L 21/31051; H01L 21/76202
  USPC ................................ 438/692, 424, 706, 296
  See application file for complete search history.

(56) References Cited

U.S. PATENT DOCUMENTS 5,728,621 A    3/1998    Zheng et al. ................. 438/427
5,874,345 A    2/1999    Coronel et al. ............... 438/427
(Continued)

OTHER PUBLICATIONS

International Search Report and Written Opinion, Application No. PCT/EP2015/057469, 11 pages, Jan. 13, 2016.

*Primary Examiner* — Shouxiang Hu
(74) *Attorney, Agent, or Firm* — Slayden Grubert Beard PLLC

(57) ABSTRACT

A layer of partially planarized organosilicate (DUO) is spin-coated onto a layer of high density plasma (HDP) oxide on a silicon wafer after the shallow trench isolation (STI) is filled with the HDP oxide. Then the DUO layer is etched using a specialized process specifically tuned to etch the DUO and high density plasma (HDP) oxide at a certain selectivity. The higher areas of the wafer topography (active Si areas) have thinner DUO and as the etch process proceeds it starts to etch through the HDP oxide in these areas (active Si areas). The etch process is stopped after a certain depth is reached and before touching down on the silicon nitride oxidation layer. The DUO is removed and a standard chemical-mechanical polish (CMP) is performed on the silicon wafer. After the CMP step the silicon nitride is removed, exposing the silicon substrate between the field oxides.

13 Claims, 9 Drawing Sheets

(51) Int. Cl.
*H01L 21/311* (2006.01)
*H01L 21/3105* (2006.01)
*H01L 21/306* (2006.01)

(52) U.S. Cl.
CPC .. *H01L 21/31138* (2013.01); *H01L 21/76202* (2013.01); *H01L 29/0649* (2013.01)

(56) References Cited

U.S. PATENT DOCUMENTS

| | | | | |
|---|---|---|---|---|
| 5,976,982 | A | * | 11/1999 | Levy ................ H01L 21/31053 257/E21.244 |
| 6,146,975 | A | * | 11/2000 | Kuehne ............ H01L 21/76229 257/510 |
| 6,391,781 | B1 | | 5/2002 | Ozawa et al. ................ 438/692 |
| 6,395,620 | B1 | | 5/2002 | Pan et al. ..................... 438/435 |
| 6,444,581 | B1 | | 9/2002 | Buschner et al. ............ 438/689 |
| 6,593,208 | B1 | * | 7/2003 | Jin ................... H01L 21/76232 257/E21.244 |
| 6,638,866 | B1 | * | 10/2003 | Cheng ................ H01L 21/3081 257/E21.232 |
| 6,949,446 | B1 | * | 9/2005 | Kamath ............ H01L 21/31055 257/E21.245 |
| 8,426,300 | B2 | * | 4/2013 | Ramachandran . H01L 21/76895 438/197 |

* cited by examiner

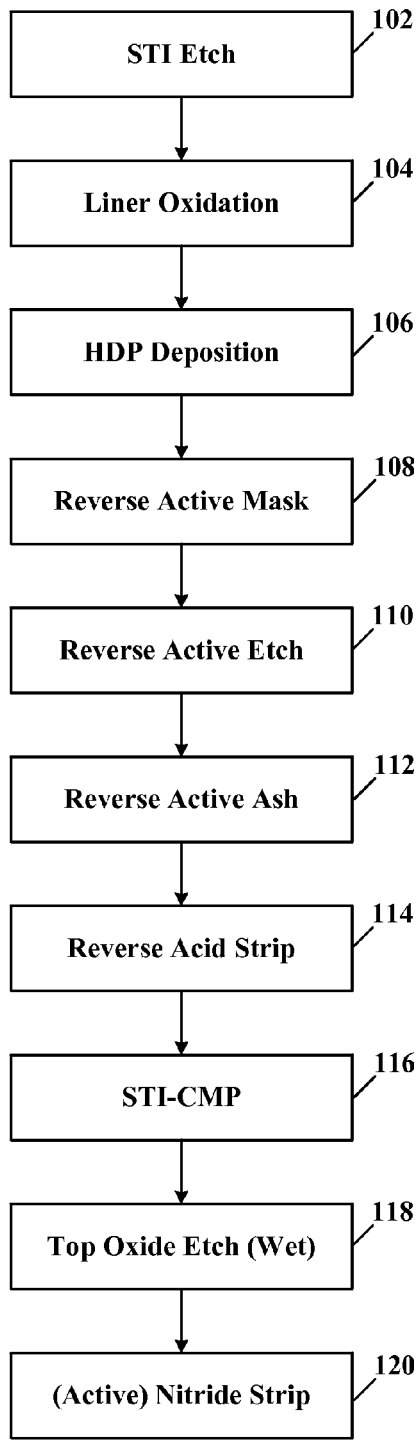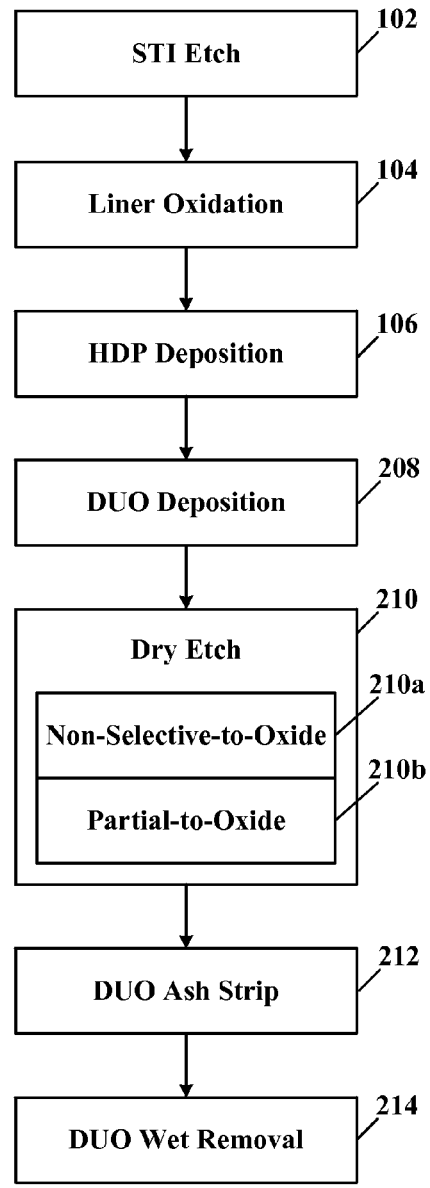
Figure 1 (Prior Art)
Figure 2

METHOD FOR PHOTOLITHOGRAPHY-FREE SELF-ALIGNED REVERSE ACTIVE ETCH

TECHNICAL FIELD

The present disclosure relates to fabrication of semiconductor integrated circuits, and more particularly, to a method of fabricating semiconductor integrated circuits using photolithography-free self-aligned reverse active etch.

BACKGROUND

There are inherent problems in trying to align a reverse active etch photomask to the already patterned active shallow trench isolation (STI). Because of small variations and errors in the lithographic process, there is a built-in overlap. In addition to the lithographic margin, the typical high density plasma (HDP) oxide fill at this process step is sloped due to the nature of the HDP oxide process. This slope forces a certain amount of overlap to prevent printing the photoresist on the angled portion of the HDP fill.

SUMMARY

Therefore, what is needed is an improved way to perform accurate reverse-active etch patterning without the use of photolithography.

According to an embodiment of a method for photolithography-free self-aligned reverse active etch of a semiconductor wafer, said method may comprise the steps of: depositing a pad oxide on a silicon substrate of a semiconductor wafer; depositing an active silicon nitride on the pad oxide; forming shallow trench isolation (STI) wells in the silicon substrate; forming an oxidization liner in the STI wells, wherein the oxidization liner may be only formed where the silicon substrate may be exposed; depositing an oxide over the silicon nitride and the STI wells; depositing a partially planarized organosilicate (DUO) layer over the oxide; performing a dry plasma etch to remove the DUO layer from the oxide; performing a chemical-mechanical polish (CMP) to remove all of the oxide covering the active silicon nitride; and removing the active silicon nitride, wherein portions of the silicon substrate may be exposed between the remaining oxide and ready for the step of active transistor element doping in the silicon substrate.

According to a further embodiment of the method, the pad oxide may be silicon nitride. According to a further embodiment of the method, the step of forming STI wells may comprise the step of etching the silicon substrate to form the STI wells. According to a further embodiment of the method, the oxidization liner may be silicon oxide. According to a further embodiment of the method, the step of depositing an oxide over the oxidation liner may comprise the step of depositing a high density plasma (HDP) oxide over the oxidation liner. According to a further embodiment of the method, the step of depositing the DUO layer over the oxide may comprise the step of spin-coating the DUO layer onto the oxide. According to a further embodiment of the method, the step of removing the DUO layer from the oxide may comprise the steps of doing a tuned etch to open the DUO layer, and etching a short selective etch to the DUO layer, wherein the semiconductor wafer may be etched in an oxide etcher. According to a further embodiment of the method, the step of removing the DUO layer from the oxide may comprise the steps of multiple dry plasma etching. According to a further embodiment of the method, the steps of multiple dry plasma etching may comprise the steps of etching non-selective to oxide and etching partial to oxide. According to a further embodiment of the method, the step of etching non-selective to oxide may use gases selected from the group consisting of $CF_4$, $O_2$, and Ar. According to a further embodiment of the method, the step of etching partial to oxide may use gases selected from the group consisting of $C_5F_8$, $O_2$, $N_2$, and Ar. According to a further embodiment of the method, the step of removing the DUO layer from the oxide may be performed until the step of performing the dry plasma etch may be completed.

According to another embodiment of a semiconductor integrated circuit prepared by a process may comprise the steps of: depositing a pad oxide on a silicon substrate of a semiconductor wafer; depositing an active silicon nitride on the pad oxide; forming shallow trench isolation (STI) wells in the silicon substrate; forming an oxidization liner in the STI wells, wherein the oxidization liner may only be formed where the silicon substrate may be exposed; depositing an oxide over the silicon nitride and the STI wells; depositing a partially planarized organosilicate (DUO) layer over the oxide; performing a dry plasma etch to remove the DUO layer from the oxide; performing a chemical-mechanical polish (CMP) to remove all of the oxide covering the active silicon nitride; and removing the active silicon nitride, wherein portions of the silicon substrate may be exposed between the remaining oxide and ready for the step of active transistor element doping in the silicon substrate.

According to a further embodiment of the process, the step of depositing an oxide over the oxidation liner may comprise the step of depositing a high density plasma (HDP) oxide over the oxidation liner. According to a further embodiment of the process, the step of removing the DUO layer from the oxide may comprise the steps of doing a tuned etch to open the DUO layer, and etching a short selective etch to the DUO layer, wherein the semiconductor wafer may be etched in an oxide etcher. According to a further embodiment of the process, the step of removing the DUO layer from the oxide may comprise the steps of multiple-step dry plasma etching. According to a further embodiment of the process, the steps of multiple-step dry plasma etching may comprise the steps of etching non-selective to oxide and etching partial to oxide. According to a further embodiment of the process, the step of etching non-selective to oxide may use gases selected from the group consisting of $CF_4$, $O_2$, and Ar. According to a further embodiment of the process, the step of etching partial to oxide may use gases selected from the group consisting of $C_5F_8$, $O_2$, $N_2$, and Ar.

According to yet another embodiment, a semiconductor wafer may have a surface treated in accordance with the steps of: depositing a pad oxide on a silicon substrate of a semiconductor wafer; depositing an active silicon nitride on the pad oxide; forming shallow trench isolation (STI) wells in the silicon substrate; forming an oxidization liner in the STI wells, wherein the oxidization liner may only be formed where the silicon substrate may be exposed; depositing an oxide over the silicon nitride and the STI wells; depositing a partially planarized organosilicate (DUO) layer over the oxide; performing a dry plasma etch to remove the DUO layer from the oxide; performing a chemical-mechanical polish (CMP) to remove all of the oxide covering the active silicon nitride; and removing the active silicon nitride, wherein portions of the silicon substrate may be exposed between the remaining oxide and ready for the step of active transistor element doping in the silicon substrate.

BRIEF DESCRIPTION OF THE DRAWINGS

A more complete understanding of the present disclosure may be acquired by referring to the following description taken in conjunction with the accompanying drawings wherein:

FIG. 1 illustrates a schematic flow diagram of prior art process fabrication steps used to form field oxides and expose a silicon substrate for further processing of active transistor element doping in the silicon substrate;

FIG. 2 illustrates a schematic flow diagram of process fabrication steps used to form field oxides and expose a silicon substrate for further processing of active transistor element doping in the silicon substrate, according to a specific example embodiment;

Figure 3:
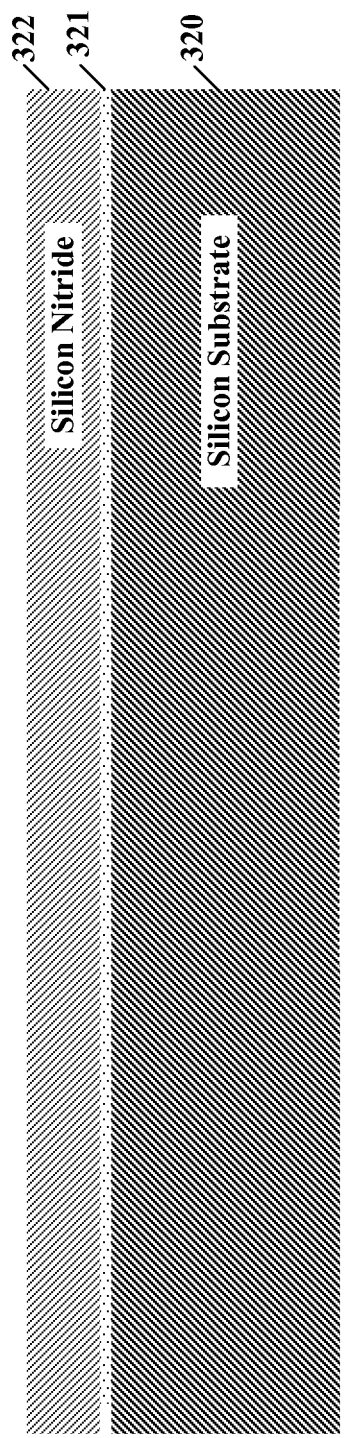
FIG. 3 illustrates a schematic elevational cross-section of a silicon wafer having a thin layer of oxide and a layer of silicon nitride deposited thereon, according to the teachings of this disclosure.

While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein, but on the contrary, this disclosure is to cover all modifications and equivalents as defined by the appended claims.

DETAILED DESCRIPTION

According to embodiments of this disclosure, no lithography is required to perform the reverse-active level patterning. Instead a layer of partially planarized organosilicate (DUO) is spin-coated onto the wafers after the shallow trench isolation (STI) fill. Then the DUO layer is etched using a specialized process specifically tuned to etch the DUO and high density plasma (HDP) oxide at a certain selectivity. The higher areas of the wafer topography (active Si areas) have thinner DUO and as the etch process proceeds it starts to etch through the HDP oxide in these areas (active Si areas). The etch process is stopped after a certain depth is achieved. These areas (active Si areas) are the same areas that would have been opened by Reverse Mask photolithography and subsequently etched (see FIG. 1, step 110). The material properties of DUO allow front-end-of-line (FEOL) application of the aforementioned process, according to a specific example embodiment of this disclosure. It is contemplated and within the scope of this disclosure that other materials may be used in place of DUO if similar control of etch selectivity is attainable.

Referring now to the drawings, the details of a specific example embodiment is schematically illustrated. Like elements in the drawings will be represented by like numbers, and similar elements will be represented by like numbers with a different lower case letter suffix.

Referring to FIG. 1, depicted is a schematic flow diagram of prior art process fabrication steps used to form field oxides and expose a silicon substrate for further processing of active transistor element doping in the silicon substrate. A prior art front-end-of-line (FEOL) process fabrication to produce a silicon wafer with shallow trench isolation (STI) field oxide (FOX) wells and ready for active transistor element doping in the silicon substrate, may comprise the following steps. In step 102, after a silicon wafer 320 has a thin layer of oxide 321 and a layer of silicon nitride 322 deposited thereon, the surface of the silicon wafer is patterned and etched to produce shallow trench isolation (STI) wells. In step 104 the surface of a silicon wafer and the STI wells are oxidized to produce a liner thereon. In step 106 a high density plasma (HDP) oxide is deposited on the wafer. In step 108 a reverse active mask is performed. In step 110 a reverse active etch is performed. In step 112 a reverse active ash ($O_2$) is performed. In step 114 a reverse acid strip on the silicon wafer is performed. In step 116 a shallow trench isolation (STI) chemical mechanical polish (CMP) is performed on the surface of the silicon wafer. In step 118 a top oxide etch is performed. In step 120 a nitride strip of the silicon wafer is preformed, leaving field oxides in the STI wells and exposed portions of the silicon wafer ready for the step of active transistor element doping in the silicon wafer substrate.

Referring to FIG. 2, depicted is a schematic flow diagram of process fabrication steps used to form field oxides and expose a silicon substrate for further processing of active transistor element doping in the silicon substrate, according to a specific example embodiment. According to a specific example embodiment of this disclosure, a new, novel and non-obvious front-end-of-line (FEOL) process fabrication to produce a silicon wafer with shallow trench isolation (STI) field oxide (FOX) wells and ready for active transistor element doping in the silicon substrate, may comprise the following steps. Steps 102, 104 and 106 are substantially the same as described in FIG. 1 above. Also refer to FIGS. 3-8 showing element numbers referenced hereinafter. Unique to this invention, the photolithography step for a reverse mask is eliminated; instead, step 208 is performed, by coating a partially planarizing organosilicate (DUO) 426 that is deposited onto the high density plasma (HDP) oxide 324. In step 210 the DUO 426 may be etched with, for example is but is not limited to, a multiple step dry-plasma etch using common process gases, e.g., $CF_4$, $C_4F_6$, $C_5F_8$, $C_4F_8$, $O_2$, $N_2$, Ar, etc. The first sub-step 210a may be non-selective-to-oxide (CF$_4$, O$_2$, Ar) and the second sub-step 210b may be partial-to-oxide (C$_5$F$_8$, O$_2$, N$_2$, Ar). Then in steps 212 and 214 the DUO 426 is striped off of all remaining areas silicon nitride using, for example but is not limited to, an oxidizing ash (O$_2$) and an HF strip, respectively. The profile of the remaining HDP 324 after etch and DUO removal is similar to the conventional reverse-mask process. The wafer may then go through CMP, TOP OXIDE ETCH, and NITRIDE STRIP just like what is done in other present technology semiconductor integrated circuit fabrication processes.

Figure 3A:
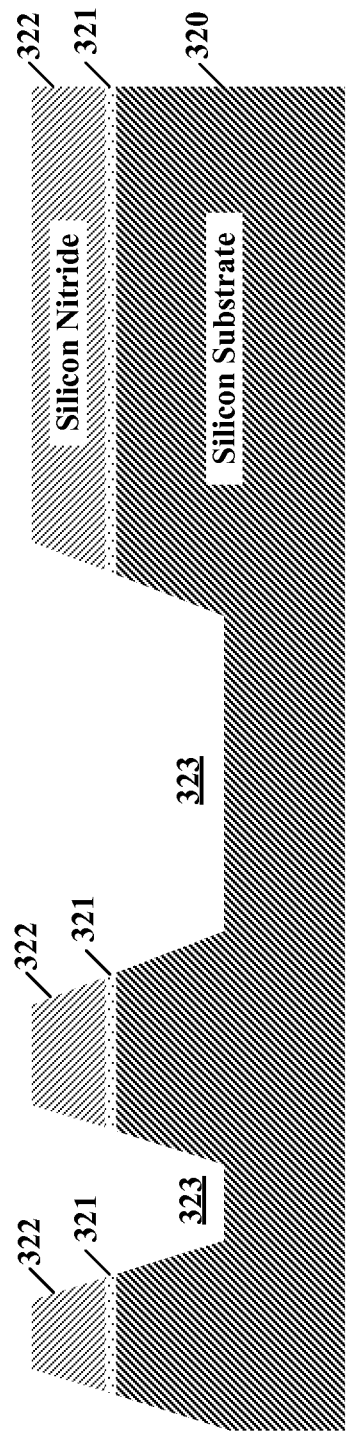
FIG. 3A illustrates a schematic elevational cross-section of a silicon wafer after the step of shallow trench isolation (STI) etch of the silicon wafer shown in FIG. 3.

Referring to FIG. 3, depicted is a schematic elevational cross-section of a silicon wafer 320 having a thin layer of oxide 321 and a layer of silicon nitride 322 deposited thereon, according to the teachings of this disclosure. Referring to FIG. 3A, depicted is a schematic elevational cross-section of the silicon wafer 320 after the step of shallow trench isolation (STI) etch 323.

Figure 3B:
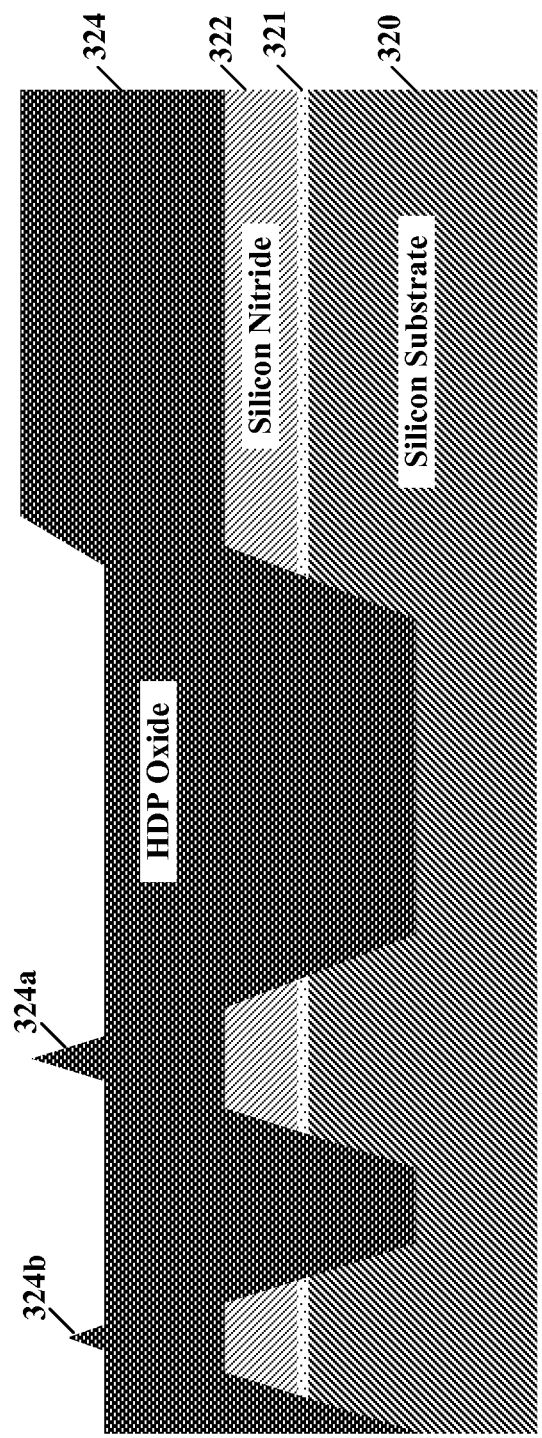
FIG. 3B illustrates a schematic elevational cross-section of a silicon wafer after performing the process steps of shallow trench isolation (STI) etch, liner oxidation and high-density plasma (HDP) deposition of the silicon wafer shown in FIGS. 3 and 3A.

Referring to FIG. 3B, depicted is a schematic elevational cross-section of a silicon wafer after performing the process steps of shallow trench isolation (STI) etch, liner oxidation and high-density plasma (HDP) deposition of the silicon wafer shown in FIGS. 3 and 3A. After the STI etch 323 is finished (FIG. 3A) a layer of HDP oxide 324 may be deposited onto the silicon substrate 320 and the silicon nitride 322. A liner oxidation is performed, oxidizing the portion of the silicon substrate 320 that was exposed by the STI etch 323. One having ordinary skill in integrated circuit fabrication and the benefit of this disclosure would understand what other oxidation materials may be used. Other oxides besides HDP oxide may be used and are contemplated herein so long as those oxides have good fill characteristics. Even Spin-On-Glass may be used, for example. The STI etch profile and the HDP oxide 324 deposition leave the top of the silicon wafer with an irregular topography.

Figure 4:
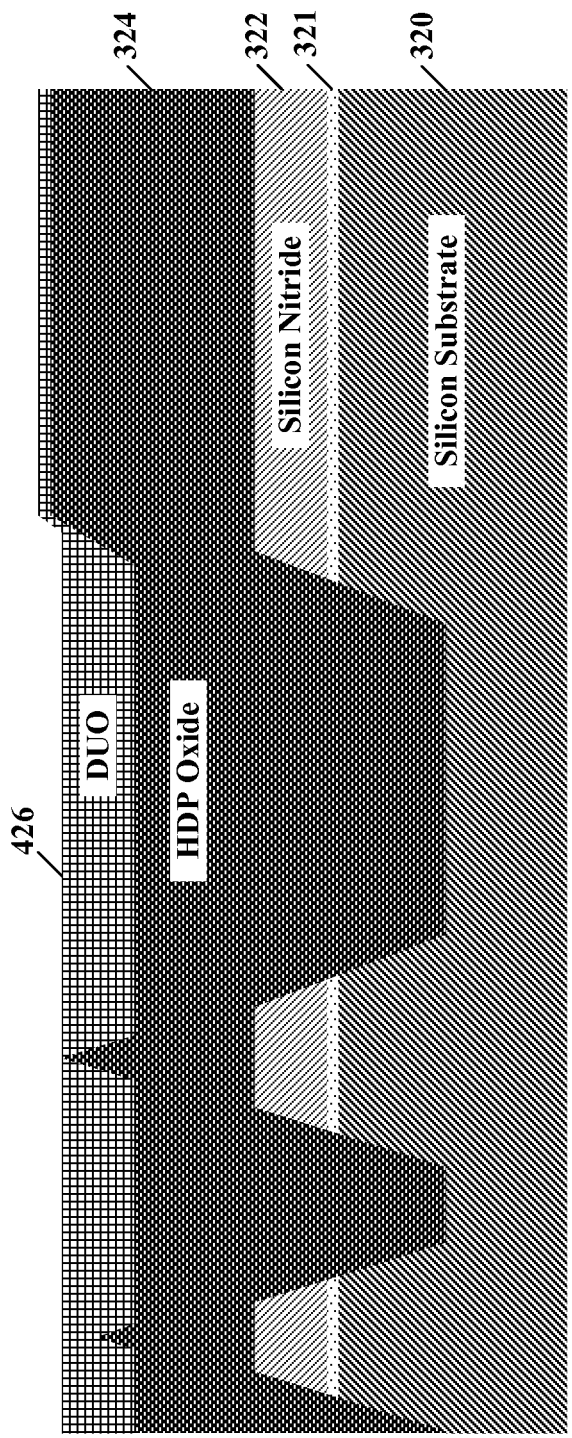
FIG. 4 illustrates a schematic elevational cross-section of the silicon wafer after performing the process step of spin-coating a layer of partially planarized organosilicate (DUO) onto the silicon wafer shown in FIG. 3, according to a specific example embodiment of this disclosure.

Referring to FIG. 4, depicted is a schematic elevational cross-section of the silicon wafer after performing the process step of spin-coating a layer of partially planarized organosilicate (DUO) onto the silicon wafer shown in FIG. 3, according to a specific example embodiment of this disclosure. In place of printing a photolithographic mask on the wafer to expose a reverse active opening, a layer of DUO 426 may be spin-coated onto the HDP oxide 324 which provides a somewhat planarizing effect thereto. More importantly, the layer of DUO 426 may be selective or non-selective to the silicon oxide based upon etch process gases mix. A preferable characteristic is that the DUO etch rate may be tuned to be selective or non-selective to the oxide that is being etched. That allows the ability to planarise the oxide stack using only etching (no mask).

Figure 5:
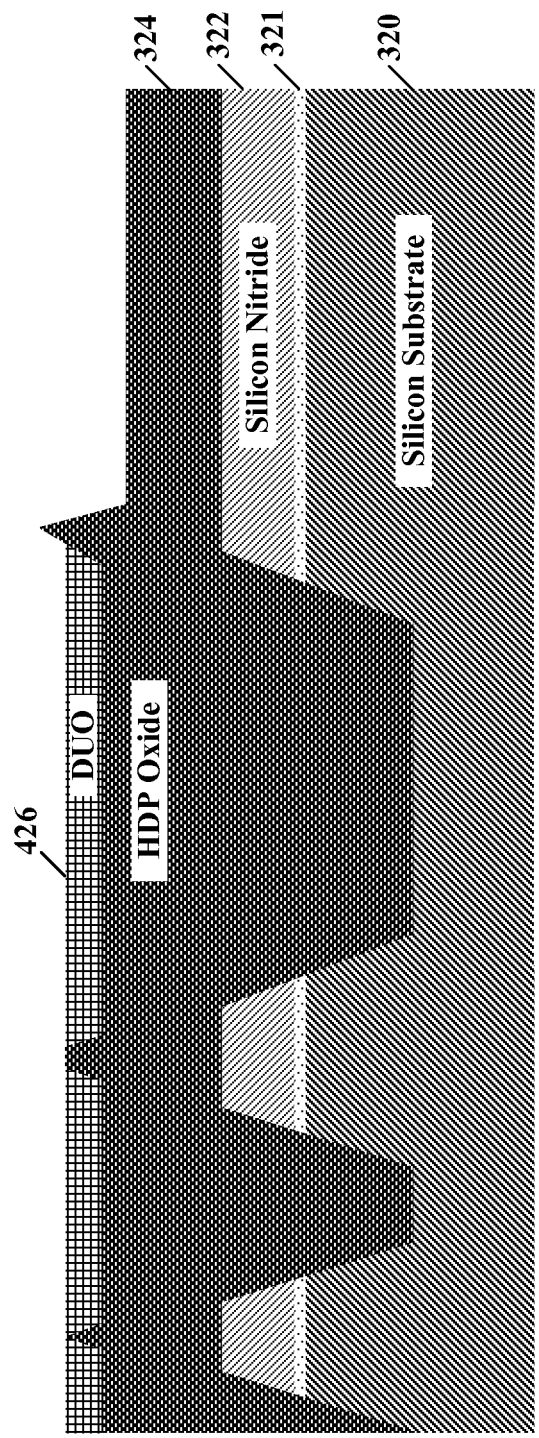
FIG. 5 illustrates a schematic elevational cross-section of the silicon wafer after performing the process step of etching the DUO on the silicon wafer shown in FIG. 4, according to a specific example embodiment of this disclosure.

Referring to FIG. 5, depicted is a schematic elevational cross-section of the silicon wafer after performing the process step of etching the DUO on the silicon wafer shown in FIG. 4, according to a specific example embodiment of this disclosure. The silicon wafer may be etched in an oxide etcher, first with a plasma etch that non-selectively etches the DUO 426, using a mixture of CF$_4$, O$_2$ and Ar. A second step may then selectively etch the HDP Oxide 324 over the DUO 426 using gases such as C$_4$F$_6$, C$_5$F$_8$, C$_4$F$_8$, O$_2$, N$_2$, and/or Ar. The etching process stops when a certain depth is reached before coming into contact with the silicon nitride 322. This first etch helps to clear the DUO 426 from active areas (above silicon nitride) and further level the stack. The second etch then attempts to etch the HDP over active areas to an approximate thickness, optimum for CMP.

Figure 6:
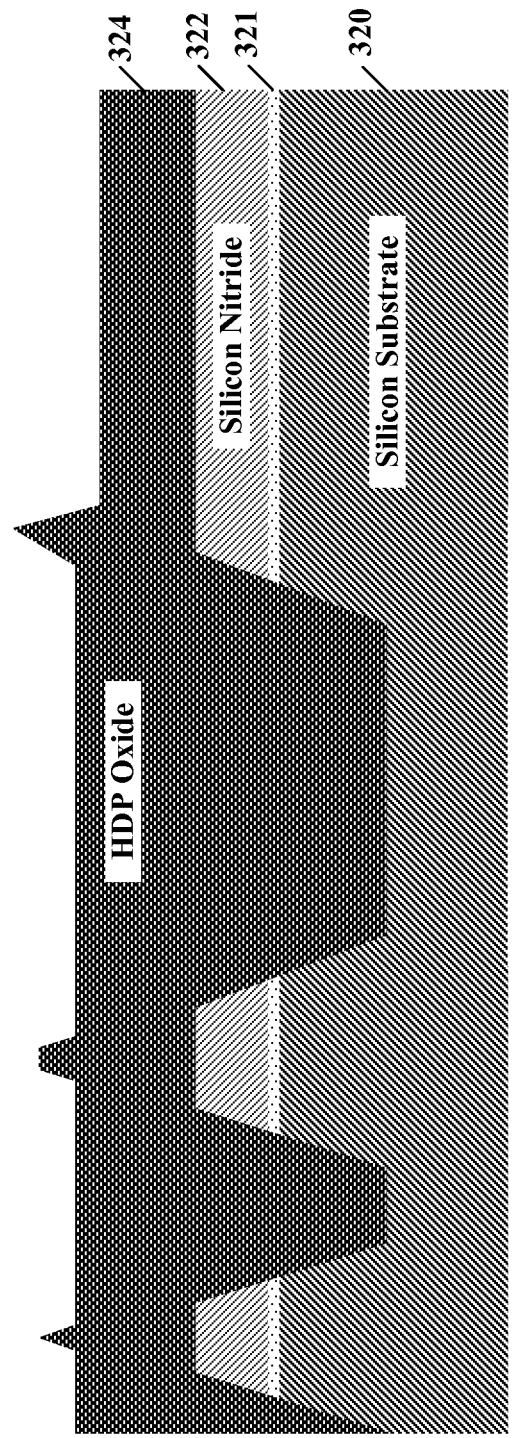
FIG. 6 illustrates a schematic elevational cross-section of the silicon wafer after performing the process step of removing the DUO on the silicon wafer shown in FIG. 5, according to a specific example embodiment of this disclosure.

FIG. 6 illustrates a schematic elevational cross-section of the silicon wafer after performing the process step of removing the DUO on the silicon wafer shown in FIG. 5, according to a specific example embodiment of this disclosure. The DUO 426 may be removed by a dry O$_2$ ash and an HF clean.

Figure 7:
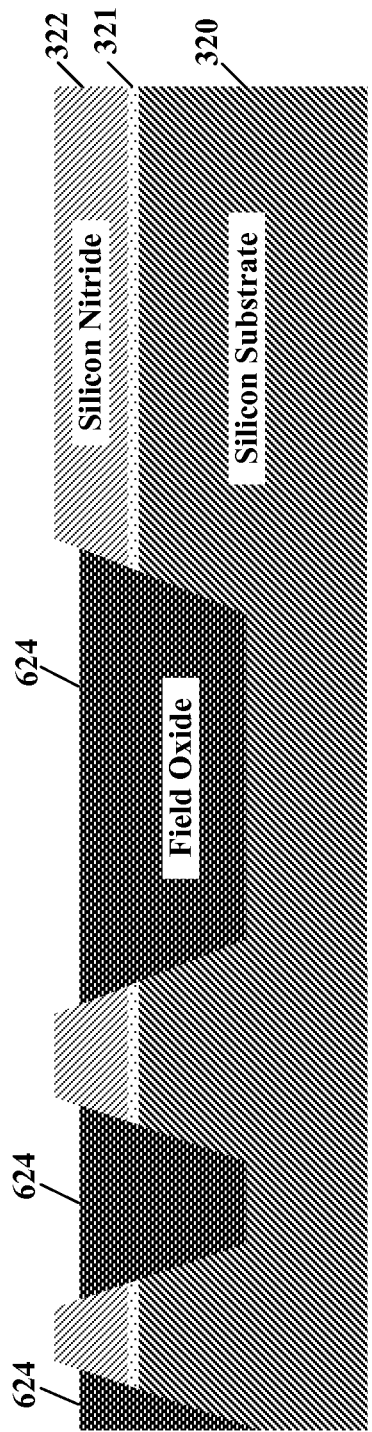
FIG. 7 illustrates a schematic elevational cross-section of the silicon wafer after performing the process step of shallow trench isolation (STI) chemical mechanical polishing (CMP), according to a specific example embodiment of this disclosure.

Referring to FIG. 7, depicted is a schematic elevational cross-section of the silicon wafer after performing the process step of shallow trench isolation (STI) chemical mechanical polishing (CMP), according to a specific example embodiment of this disclosure. The STI CMP is a standard semiconductor integrated circuit process well known to one having ordinary skill in semiconductor integrated circuit manufacturing. In this step the HDP oxide 324 is substantially planarized and removed from the layer of silicon nitride 322.

Figure 8:
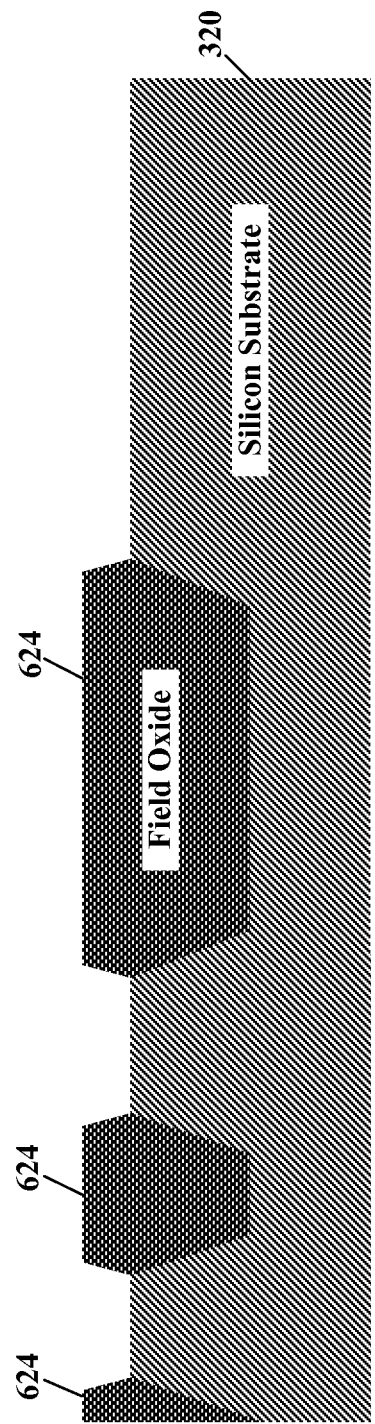
FIG. 8 illustrates a schematic elevational cross-section of the silicon wafer after performing the process step of removing the silicon nitride to expose portions of the silicon substrate, according to a specific example embodiment of this disclosure.

Referring to FIG. 8, depicted is a schematic elevational cross-section of the silicon wafer after performing the process step of removing the silicon nitride to expose portions of the silicon substrate, according to a specific example embodiment of this disclosure. The silicon nitride 322 may be removed by using a hot phosphoric acid bath, leaving the silicon substrate 320 exposed between field oxides (FOX) 624, ready for the step of active transistor element doping in the silicon substrate.

It is contemplated and within the scope of this disclosure that the aforementioned integrated circuit fabrication process could be used in other fabrication steps such as oxide CMP. It may not be economical as this process would add cost at the other steps. The liner oxidation is not silicon nitride; it is made of thermally-grown silicon dioxide. Any oxide deposition or fill may be used provided it meets the filling requirement for the given STI process. DUO is fairly unique because it was designed for fill and with the ability to change selectivity with different plasma etch processes. Bottom anti-reflective-coating BARC has been used in place of DUO for some processing, and it might be applicable in the present process application disclosed herein.

While embodiments of this disclosure have been depicted, described, and are defined by reference to example embodiments of the disclosure, such references do not imply a limitation on the disclosure, and no such limitation is to be inferred. The subject matter disclosed is capable of considerable modification, alteration, and equivalents in form and function, as will occur to those ordinarily skilled in the pertinent art and having the benefit of this disclosure. The depicted and described embodiments of this disclosure are examples only, and are not exhaustive of the scope of the disclosure.

What is claimed is:
1. A method for photolithography-free self-aligned reverse active etch of a semiconductor wafer, said method comprising the steps of:
   depositing a pad oxide on a silicon substrate of the semiconductor wafer;
   depositing an active silicon nitride on the pad oxide;
   forming shallow trench isolation (STI) wells in the silicon substrate;
   forming an oxidization liner in the STI wells, wherein the oxidization liner is only formed where the silicon substrate is exposed;
   depositing an oxide over the silicon nitride and the STI wells;
   depositing a partially planarized organosilicate layer over the oxide;
   performing a dry plasma etch to remove the partially planarized organosilicate layer from the oxide by first non-selective etching thereby removing some of the partially planarized organosilicate layer and some of the oxide and then selectively etching the oxide thereby only removing the oxide, wherein the oxide above the silicon nitride is removed to a predefined thickness;

performing a chemical-mechanical polish (CMP) to remove all of the oxide covering the active silicon nitride; and removing the active silicon nitride, wherein portions of the silicon substrate are exposed between the remaining oxide and ready for the step of active transistor element doping in the silicon substrate.

2. The method according to claim 1, wherein the pad oxide is silicon oxide.

3. The method according to claim 1, wherein the step of forming STI wells comprises the step of etching the silicon substrate to form the STI wells.

4. The method according to claim 1, wherein the oxidization liner is silicon oxide.

5. The method according to claim 1, wherein the step of depositing an oxide comprises the step of depositing a high density plasma (HDP) oxide layer.

6. The method according to claim 5, wherein the step of performing the dry plasma etch comprises the steps of doing a tuned etch to open the partially planarized organosilicate layer above the silicon nitride, and etching a short selective etch removing only the HDP oxide layer, wherein the semiconductor wafer is etched in an oxide etcher.

7. The method according to claim 1, wherein the step of depositing the partially planarized organosilicate layer over the oxide comprises the step of spin-coating the partially planarized organosilicate layer onto the oxide.

8. The method according to claim 7, wherein the step of spin coating comprises even spin-on-glass.

9. The method according to claim 1, wherein the step of non-selective etching uses gases selected from the group consisting of $CF_4$, $O_2$, and Ar.

10. The method according to claim 1, wherein the step of selectively etching uses gases selected from the group consisting of $C_5F_8$, $O_2$, $N_2$, and Ar.

11. The method according to claim 1, wherein after performing the dry plasma etch and before performing the CMP, remaining partially planarized organosilicate is stripped off.

12. The method according to claim 11, comprising the step of performing an oxidizing ash to strip off the remaining partially planarized organosilicate.

13. The method according to claim 11, comprising the step of performing an HF strip to strip off the remaining partially planarized organosilicate.

* * * * *